(12) United States Patent
Kobayashi et al.

(10) Patent No.: US 11,777,028 B2
(45) Date of Patent: Oct. 3, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yusuke Kobayashi, Nagareyama (JP); Akihiro Goryu, Kanazawa (JP); Ryohei Gejo, Kawasaki (JP); Hiro Gangi, Ota (JP); Tomoaki Inokuchi, Yokohama (JP); Shotaro Baba, Kanazawa (JP); Tatsuya Nishiwaki, Komatsu (JP); Tsuyoshi Kachi, Kanazawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 182 days.

(21) Appl. No.: 17/395,070

(22) Filed: Aug. 5, 2021

(65) Prior Publication Data
US 2022/0190154 A1    Jun. 16, 2022

(30) Foreign Application Priority Data
Dec. 11, 2020    (JP) .................................. 2020-205605

(51) Int. Cl.
*H01L 29/78* (2006.01)
*H01L 29/40* (2006.01)
(Continued)

(52) U.S. Cl.
CPC ...... *H01L 29/7813* (2013.01); *H01L 29/0607* (2013.01); *H01L 29/32* (2013.01); *H01L 29/407* (2013.01)

(58) Field of Classification Search
CPC . H01L 29/7813; H01L 29/0607; H01L 29/32; H01L 21/322
See application file for complete search history.

(56) References Cited

U.S. PATENT DOCUMENTS 6,610,572 B1   8/2003 Takei et al.
8,723,253 B2   5/2014 Ohta et al.
(Continued)

FOREIGN PATENT DOCUMENTS

JP    2009-130002 A    6/2009
JP    4791704 B2    10/2011
(Continued)

*Primary Examiner* — Joseph C. Nicely
(74) *Attorney, Agent, or Firm* — Oblon, McClelland, Maier & Neustadt, L.L.P.

(57) ABSTRACT

According to one embodiment, a semiconductor device includes first to third electrodes, a first conductive member, a semiconductor member, and a first insulating member. The third electrode includes a third electrode end portion and a third electrode other-end portion. The first conductive member includes a first conductive member end portion and a first conductive member other-end portion. The first conductive member is electrically connected with one of the second electrode or the third electrode. The semiconductor member includes first to fourth semiconductor regions. The first semiconductor region includes first and second partial regions. The third semiconductor region is electrically connected with the second electrode. The fourth semiconductor region is electrically connected with the first electrode. At least a portion of the first insulating member is between the semiconductor member and the third electrode and between the semiconductor member and the first conductive member.

17 Claims, 9 Drawing Sheets

(51) Int. Cl.
*H01L 29/06* (2006.01)
*H01L 29/32* (2006.01)

(56) References Cited

U.S. PATENT DOCUMENTS

| | | | |
|---|---|---|---|
| 10,622,350 B2 | 4/2020 | Kanetake et al. | |
| 2005/0258493 A1 | 11/2005 | Aono et al. | |
| 2012/0241854 A1* | 9/2012 | Ohta | H01L 29/7813 |
| | | | 438/270 |
| 2013/0093065 A1 | 4/2013 | Kachi et al. | |
| 2013/0260515 A1 | 10/2013 | Mizushima | |
| 2014/0246750 A1 | 9/2014 | Takishita et al. | |
| 2014/0246755 A1 | 9/2014 | Yoshimura et al. | |
| 2015/0014764 A1 | 1/2015 | Tamura et al. | |
| 2016/0307993 A1 | 10/2016 | Kuribayashi et al. | |
| 2017/0018434 A1 | 1/2017 | Onozawa | |
| 2018/0012762 A1 | 1/2018 | Mukai et al. | |
| 2022/0085177 A1* | 3/2022 | Kachi | H01L 29/7805 |
| 2022/0085208 A1* | 3/2022 | Oasa | H01L 29/7813 |
| 2023/0101684 A1* | 3/2023 | Nakamura | H01L 29/0696 |
| | | | 257/288 |

FOREIGN PATENT DOCUMENTS

| | | |
|---|---|---|
| JP | 4862207 B2 | 1/2012 |
| JP | 2012-204395 A | 10/2012 |
| JP | 5396689 B2 | 1/2014 |
| JP | 5741712 B2 | 7/2015 |
| JP | 5776485 B2 | 9/2015 |
| JP | 5825329 B2 | 12/2015 |
| JP | 6067585 B2 | 1/2017 |
| JP | 6078961 B2 | 2/2017 |
| JP | 6107858 B2 | 4/2017 |
| JP | 6144510 B2 | 6/2017 |
| JP | 6221436 B2 | 11/2017 |
| JP | 6237902 B2 | 11/2017 |
| JP | 6237921 B2 | 11/2017 |
| JP | 6477897 B2 | 3/2019 |
| JP | 2019-140322 A | 8/2019 |

\* cited by examiner

SEMICONDUCTOR DEVICE

CROSS-REFERENCE TO RELATED APPLICATIONS

This application is based upon and claims the benefit of priority from Japanese Patent Application No. 2020-205605, filed on Dec. 11, 2020; the entire contents of which are incorporated herein by reference.

FIELD

Embodiments described herein relate generally to a semiconductor device.

BACKGROUND

For example, it is desirable to improve the characteristics of a semiconductor device such as a transistor or the like.

DETAILED DESCRIPTION

Figure 1:
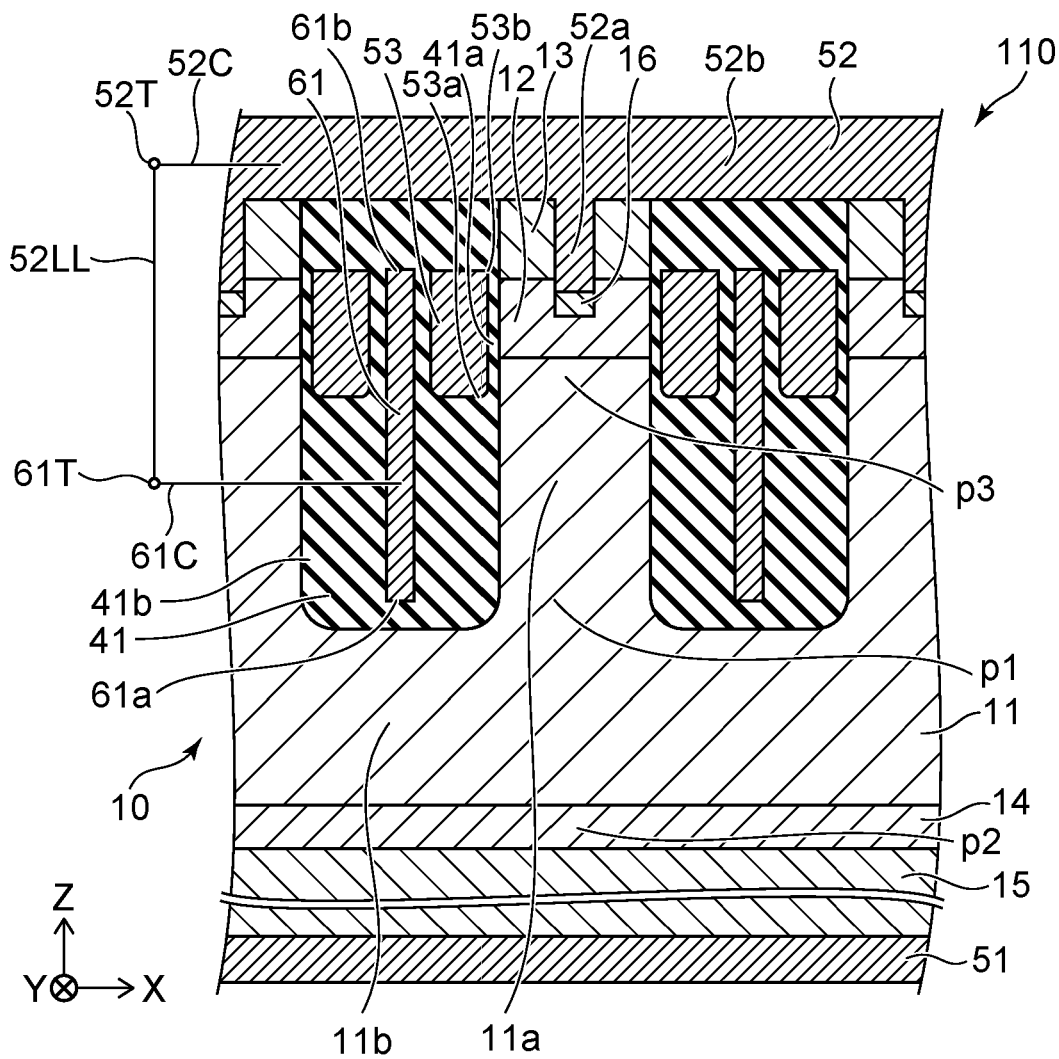
FIG. 1 is a schematic cross-sectional view illustrating a semiconductor device according to a first embodiment.

According to one embodiment, a semiconductor device includes a first electrode, a second electrode, a third electrode, a first conductive member, a semiconductor member, and a first insulating member. A direction from the first electrode toward the second electrode is along a first direction. The third electrode includes a third electrode end portion and a third electrode other-end portion. The third electrode end portion is between the first electrode and the third electrode other-end portion in the first direction. The first conductive member includes a first conductive member end portion and a first conductive member other-end portion. The first conductive member end portion is between the first electrode and the first conductive member other-end portion in the first direction. A position in the first direction of the first conductive member end portion is between a position in the first direction of the first electrode and a position in the first direction of the third electrode end portion. The first conductive member is electrically connected with one of the second electrode or the third electrode or is electrically connectable with the one of the second electrode or the third electrode. The semiconductor member includes a first semiconductor region of a first conductivity type, a second semiconductor region of a second conductivity type, a third semiconductor region of the first conductivity type, and a fourth semiconductor region of the first conductivity type. The first semiconductor region includes a first partial region and a second partial region. The first partial region is between the first electrode and the second electrode in the first direction. The second semiconductor region is between the first partial region and the third semiconductor region in the first direction. The third semiconductor region is electrically connected with the second electrode. A second direction from a portion of the third electrode toward the second semiconductor region crosses the first direction. A direction from an other portion of the third electrode toward a portion of the first partial region is along the second direction. A direction from the second partial region toward the first conductive member is along the first direction. A direction from the first conductive member toward the first partial region is along the second direction. The fourth semiconductor region is located between the first electrode and the first semiconductor region in the first direction. The fourth semiconductor region is electrically connected with the first electrode. A carrier concentration of the first conductivity type in the fourth semiconductor region is greater than a carrier concentration of the first conductivity type in the first semiconductor region. The first partial region includes a first position. A direction from the first conductive member end portion toward the first position is along the second direction. A defect density in the fourth semiconductor region is greater than a first defect density at the first position. At least a portion of the first insulating member is between the semiconductor member and the third electrode and between the semiconductor member and the first conductive member.

According to one embodiment, a semiconductor device includes a first electrode, a second electrode, a third electrode, a first conductive member, a semiconductor member, and a first insulating member. A direction from the first electrode toward the second electrode is along a first direction. The third electrode includes a third electrode end portion and a third electrode other-end portion. The third electrode end portion is between the first electrode and the third electrode other-end portion in the first direction. The first conductive member includes a first conductive member end portion and a first conductive member other-end portion. The first conductive member end portion is between the first electrode and the first conductive member other-end portion in the first direction. A position in the first direction of the first conductive member end portion is between a position in the first direction of the first electrode and a position in the first direction of the third electrode end portion. The semiconductor member includes a first semiconductor region of a first conductivity type, a second semiconductor region of a second conductivity type, a third semiconductor region of the first conductivity type, and a fourth semiconductor region of the first conductivity type. The first semiconductor region includes a first partial region and a second partial region. The first partial region is between the first electrode and the second electrode in the first direction. The second semiconductor region is between the first partial region and the third semiconductor region in the first direction. The third semiconductor region is electrically connected with the second electrode. A second direction from a portion of the third electrode toward the second semiconductor region crosses the first direction. A direction from an other portion of the third electrode toward a portion of the first partial region is along the second direction. A direction from the second partial region toward the first conductive member is along the first direction. A direction from the first conductive member toward the first partial region is along the second direction. The fourth semiconductor region is located between the first electrode and the first semiconductor region in the first direction. The fourth semiconductor region is electrically connected with the first electrode. A carrier concentration of the first conductivity type in the fourth semiconductor region is greater than a carrier concentration of the first conductivity type in the first semiconductor region. The first partial region includes a first position. A direction from the first conductive member end portion toward the first position is along the second direction. The fourth semiconductor region includes at least one first element selected from the group consisting of hydrogen, helium, argon, and carbon. The first position does not include the first element, or a concentration of the first element at the first position is less than a concentration of the first element in the fourth semiconductor region. At least a portion of the first insulating member is between the semiconductor member and the third electrode and between the semiconductor member and the first conductive member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first conductive member 61, a semiconductor member 10, and a first insulating member 41.

The direction from the first electrode 51 toward the second electrode 52 is along a first direction. The first direction is taken as a Z-axis direction. A direction perpendicular to the Z-axis direction is taken as an X-axis direction. A direction perpendicular to the Z-axis direction and the X-axis direction is taken as a Y-axis direction.

The position in the first direction (the Z-axis direction) of the third electrode 53 is between the position in the first direction of the first electrode 51 and the position of the first direction of the second electrode 52. The third electrode 53 includes a third electrode end portion 53a and a third electrode other-end portion 53b. The third electrode end portion 53a and the third electrode other-end portion 53b are Z-axis direction end portions. The third electrode end portion 53a is between the first electrode 51 and the third electrode other-end portion 53b in the first direction (the Z-axis direction). The third electrode end portion 53a is the end portion of the third electrode 53 at the first electrode 51 side. The third electrode end portion 53a is, for example, the lower end portion.

The first conductive member 61 includes a first conductive member end portion 61a and a first conductive member other-end portion 61b. The first conductive member end portion 61a and the first conductive member other-end portion 61b are Z-axis direction end portions. The first conductive member end portion 61a is between the first electrode 51 and the first conductive member other-end portion 61b in the first direction. The first conductive member end portion 61a is, for example, the lower end portion. The position in the first direction of the first conductive member end portion 61a is between the position in the first direction of the first electrode 51 and the position of the first direction of the third electrode end portion 53a. The distance along the Z-axis direction between the first conductive member end portion 61a and the first electrode 51 is less than the distance along the Z-axis direction between the third electrode end portion 53a and the first electrode 51.

The first conductive member 61 is electrically connected with one of the second electrode 52 or the third electrode 53. Or, the first conductive member 61 is electrically connectable with one of the second electrode 52 or the third electrode 53. In the semiconductor device 110, the first conductive member 61 is electrically connected with the second electrode 52.

For example, as shown in FIG. 1, the first conductive member 61 is electrically connected with the second electrode 52 via a connection member 61C, a connection member 52LL, and a connection member 52C. These connection members may be located at a position that is different from the cross section illustrated in FIG. 1. For example, a terminal 52T may be connected with the second electrode 52 via the connection member 52C. A terminal 61T may be electrically connected with the first conductive member 61 via the connection member 61C. The terminal 61T may be electrically connected with the terminal 52T by a connection member 52LL. The connection member 52LL may be provided separately from the semiconductor device 110.

For example, the semiconductor member 10 is between the first electrode 51 and the second electrode 52. The semiconductor member 10 includes, for example, a semiconductor such as silicon, etc.

The semiconductor member 10 includes a first semiconductor region 11 of a first conductivity type, a second semiconductor region 12 of a second conductivity type, a third semiconductor region 13 of the first conductivity type, and a fourth semiconductor region 14 of the first conductivity type. As shown in FIG. 1, the semiconductor member 10 may further include a fifth semiconductor region 15. As shown in FIG. 1, the semiconductor member 10 may further include a sixth semiconductor region 16.

For example, the first conductivity type is an n-type; and the second conductivity type is a p-type. According to the embodiment, the first conductivity type may be the p-type; and the second conductivity type may be the n-type. In the following example, the first conductivity type is the n-type; and the second conductivity type is the p-type.

The first semiconductor region 11 includes a first partial region 11a and a second partial region 11b. For example, the first partial region 11a is between the first electrode 51 and the second electrode 52 in the first direction (the Z-axis direction).

The second semiconductor region 12 is between the first partial region 11a and the third semiconductor region 13 in the first direction (the Z-axis direction). For example, the first partial region 11a, the second semiconductor region 12, and the third semiconductor region 13 are between the first electrode 51 and the second electrode 52. The third semiconductor region 13 is electrically connected with the second electrode 52.

A second direction from a portion of the third electrode 53 toward the second semiconductor region 12 crosses the first direction. The second direction is, for example, the X-axis direction.

The direction from another portion of the third electrode 53 toward a portion of the first partial region 11a is along the second direction (e.g., the X-axis direction).

The direction from the second partial region 11b of the first semiconductor region 11 toward the first conductive member 61 is along the first direction (the Z-axis direction). The direction from the first conductive member 61 toward the first partial region 11a is along the second direction (e.g., the X-axis direction).

The fourth semiconductor region 14 is located between the first electrode 51 and the first semiconductor region 11 in the first direction (the Z-axis direction). The fourth semiconductor region 14 is electrically connected with the first electrode 51. When the fifth semiconductor region 15 is provided, the fifth semiconductor region 15 is between the first electrode 51 and the fourth semiconductor region 14. For example, the fifth semiconductor region 15 is of the first conductivity type. The fifth semiconductor region 15 may be, for example, a semiconductor substrate.

The first-conductivity-type carrier concentration in the fourth semiconductor region 14 is greater than the first-conductivity-type carrier concentration in the first semiconductor region 11. The first semiconductor region 11 is, for example, an n-region or an n$^-$-region. The fourth semiconductor region 14 is, for example, an n$^+$-region.

The first-conductivity-type carrier concentration in the fifth semiconductor region 15 is greater than the first-conductivity-type carrier concentration in the first semiconductor region 11. The first-conductivity-type carrier concentration in the fifth semiconductor region 15 is greater than the first-conductivity-type carrier concentration in the fourth semiconductor region 14. The fifth semiconductor region 15 is, for example, an n$^+$-region or an n$^{++}$-region. By providing the fourth semiconductor region 14 and the fifth semiconductor region 15, the resistance of the electrical connection of the first electrode 51 can be reduced. For example, a low on-resistance is obtained.

The first-conductivity-type carrier concentration in the third semiconductor region 13 is greater than the first-conductivity-type carrier concentration in the first semiconductor region 11. The third semiconductor region 13 is, for example, an n$^+$-region.

When the sixth semiconductor region 16 is provided, for example, the sixth semiconductor region 16 is located between the second semiconductor region 12 and the second electrode 52. The sixth semiconductor region 16 is of the second conductivity type (e.g., the p-type). The second-conductivity-type carrier concentration in the sixth semiconductor region 16 is greater than the second-conductivity-type carrier concentration in the second semiconductor region 12. For example, the second semiconductor region 12 is a p-region. The sixth semiconductor region 16 is a p$^+$-region. By providing the sixth semiconductor region 16, the resistance of the electrical connection of the second electrode 52 can be reduced. For example, a low on-resistance is obtained.

At least a portion of the first insulating member 41 is between the semiconductor member 10 and the third electrode 53 and between the semiconductor member 10 and the first conductive member 61. For example, the first insulating member 41 includes a first insulating region 41a and a second insulating region 41b. For example, the first insulating region 41a is between the third electrode 53 and the second semiconductor region 12 in the second direction (e.g., the X-axis direction). The second insulating region 41b is between the first conductive member 61 and the semiconductor member 10.

For example, the current that flows between the first electrode 51 and the second electrode 52 can be controlled by the potential of the third electrode 53. The potential of the third electrode 53 is, for example, a potential that is referenced to the potential of the second electrode 52. For example, the first electrode 51 functions as a drain electrode. For example, the second electrode 52 functions as a source electrode. For example, the third electrode 53 functions as a gate electrode. For example, the first insulating region 41a functions as a gate insulating film. For example, the first conductive member 61 functions as a field plate. The semiconductor device 110 is, for example, a transistor.

According to the embodiment, the fourth semiconductor region 14 includes defects. The defects are of the crystal of the semiconductor member 10 (e.g., silicon). For example, the defects can be formed by introducing an element that includes at least one selected from the group consisting of helium and hydrogen into the semiconductor member 10. The introduction of the element may be performed through the upper surface or the lower surface of the semiconductor member 10.

For example, the defect density in the fourth semiconductor region 14 is greater than the defect density in the first partial region 11a. By increasing the defect density in the fourth semiconductor region 14, for example, the loss can be reduced. For example, the implantation of carriers into the region of the first semiconductor region 11 at the first electrode 51 side in the forward operation can be suppressed. For example, a reverse recovery charge Qrr can be reduced. The reverse recovery loss can be reduced thereby. By setting the defect density in the first partial region 11a to be low, for example, the off-leakage current can be suppressed. According to the embodiment, for example, the loss can be reduced while suppressing the off-leakage. According to the embodiment, a semiconductor device can be provided in which the characteristics can be improved.

As shown in FIG. 1, the first partial region 11a includes a first position p1. The direction from the first conductive member end portion 61a toward the first position p1 is along the second direction. For example, the defect density at the first position p1 is less than the defect density in the fourth semiconductor region 14.

An example of defect densities will now be described.

Figure 2A:
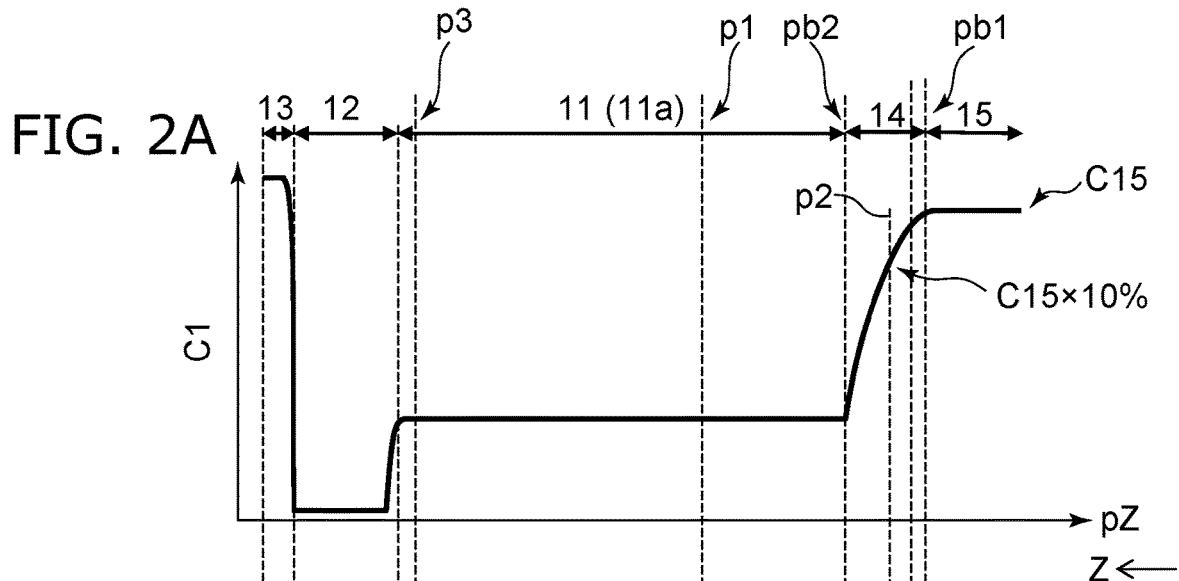
FIGS. 2A to 2C are graphs illustrating characteristics of the semiconductor device according to the first embodiment.
Figure 2B:
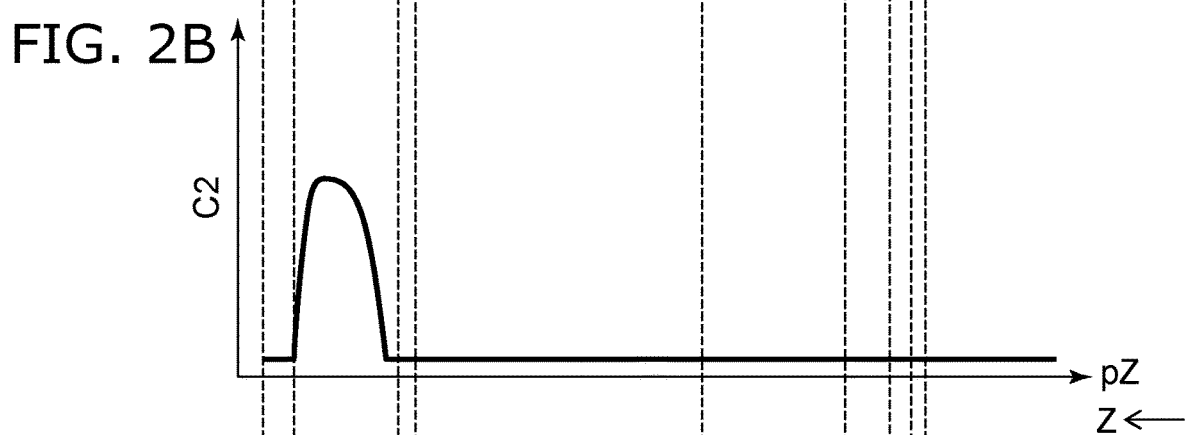
Figure 2C:
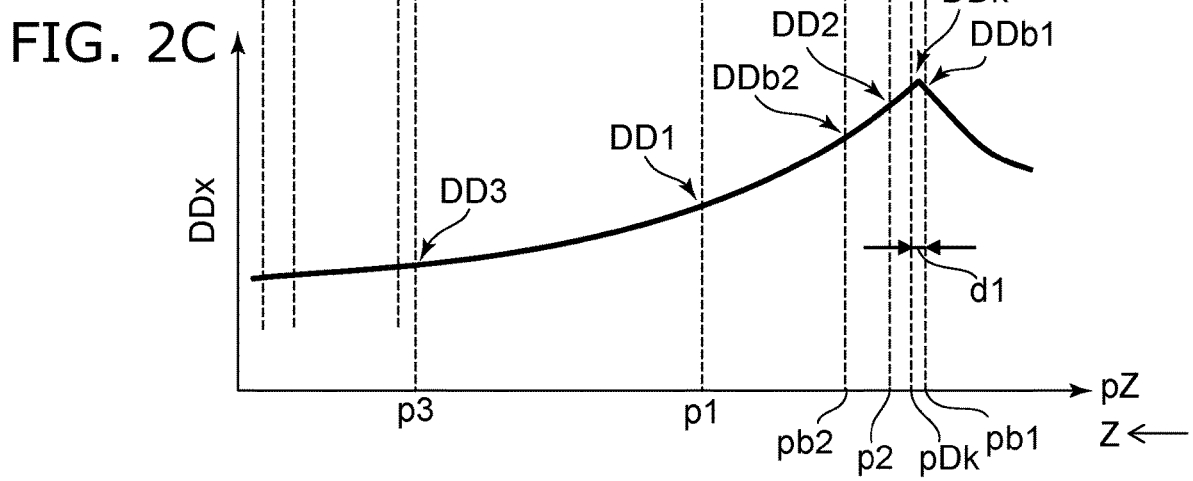

FIGS. 2A to 2C are graphs illustrating characteristics of the semiconductor device according to the first embodiment.

In these figures, the horizontal axis is a position pZ in the Z-axis direction. The vertical axis of FIG. 2A is an impurity concentration C1 of the first conductivity type in the semiconductor member 10. The vertical axis of FIG. 2B is an impurity concentration C2 of the second conductivity type in the semiconductor member 10. For example, the magnitude of the difference between the impurity concentration C1 and the impurity concentration C2 corresponds to the level of the carrier concentration. To simplify the following description, a case is described where the first-conductivity-type carrier concentrations of the first semiconductor region 11, the fourth semiconductor region 14, and the fifth semiconductor region 15 substantially correspond to the impurity concentration C1 of the first conductivity type. The vertical axis of FIG. 2C is a defect density DDx. In FIGS. 2A to 2C, the vertical axis is shown logarithmically.

As shown in FIGS. 2A and 2B, the first-conductivity-type carrier concentration in the third semiconductor region 13 is high. The second-conductivity-type carrier concentration in the second semiconductor region 12 is high. The first-conductivity-type carrier concentration in the first semiconductor region 11 is low. The first-conductivity-type carrier concentration in the fourth semiconductor region 14 increases from the first-conductivity-type carrier concentration of the first semiconductor region 11. The first-conductivity-type carrier concentration in the fifth semiconductor region 15 is high. For example, the first-conductivity-type carrier concentration (an impurity concentration C15) in the fifth semiconductor region 15 is substantially constant. The first-conductivity-type carrier concentration in the fourth semiconductor region 14 is, for example, less than the first-conductivity-type carrier concentration (the impurity concentration C15) in the fifth semiconductor region 15.

The position in the first direction (the Z-axis direction) of the boundary (a first boundary) between the fourth semiconductor region 14 and the fifth semiconductor region 15 is taken as a first boundary position pb1. For convenience, the first-conductivity-type carrier concentration (the impurity concentration) at the first boundary position pb1 is taken to be 51% of the first-conductivity-type carrier concentration (the impurity concentration C15) in the fifth semiconductor region 15.

The position in the first direction (the Z-axis direction) of the boundary (a second boundary) between the fourth semiconductor region 14 and the first semiconductor region 11 is taken as a second boundary position pb2. The first-conductivity-type carrier concentration (the impurity concentration C1) at the second boundary position pb2 is 101% of the first-conductivity-type carrier concentration (the impurity concentration C1) in the first semiconductor region 11. As shown in FIG. 1, the first-conductivity-type carrier concentration (the impurity concentration C1) in the fourth semiconductor region 14 increases from the second boundary position pb2 toward the first boundary position pb1.

As shown in FIG. 2A, the fourth semiconductor region 14 may include a second position p2. The first-conductivity-type carrier concentration (the impurity concentration C1) at the second position p2 is 10% of the first-conductivity-type carrier concentration (the impurity concentration C15) in the fifth semiconductor region 15.

As shown in FIG. 2C, the defect density DDx is high in the fourth semiconductor region 14. The defect density DDx may be high in at least a portion of the fifth semiconductor region 15. The defect density DDx decreases in the first semiconductor region 11 (the first partial region 11a) in the orientation from the fourth semiconductor region 14 toward the second semiconductor region 12. For example, the defect density DDx in the semiconductor member 10 has a maximum in the fourth semiconductor region 14 or the fifth semiconductor region 15.

The defect density DDx at the first position p1 described above is taken as a first defect density DD1. The defect density DDx in the fourth semiconductor region 14 is greater than the first defect density DD1. For example, the reverse recovery charge Qrr can be reduced by such a profile of the defect density DDx. For example, the off-leakage current can be suppressed. For example, the loss can be reduced while suppressing the off-leakage. For example, it is considered that the shortening of the charge lifetime by the defects may cause such a phenomenon.

For example, as shown in FIG. 2C, the position in the first direction (the Z-axis direction) at which a maximum defect density DDk of the semiconductor member 10 is obtained is taken as a defect peak position pDk. The defect peak position pDk is in the fourth semiconductor region 14 or the fifth semiconductor region 15. As described below, it is more favorable for the defect peak position pDk to be in the fourth semiconductor region 14.

In one example, a defect density DDb1 at the first boundary position pb1 is greater than the first defect density DD1. A defect density DDb2 at the second boundary position pb2 is greater than the first defect density DD1. A second defect density DD2 at the second position p2 is greater than the first defect density DD1.

According to the embodiment, for example, an off-leakage current Idss can be reduced by reducing the first defect density DD1 at the first position p1.

There is a first reference example that does not include the first conductive member 61 (e.g., the field plate). In the first reference example, hard recovery occurs, and a large surge voltage is generated thereby. In the first reference example, the surge voltage increases when the defect density DDx in the region (e.g., the fourth semiconductor region 14) that is proximate to the first electrode 51 is increased. Therefore, in the first reference example, a configuration is employed in which the defect density DDx in the region (e.g., the fourth semiconductor region 14) that is proximate to the first electrode 51 is set to be less than the defect density (e.g., the first defect density DD1) at the first position p1, etc.

Conversely, the embodiment includes the first conductive member 61. In such a configuration, for example, due to a built-in snubber effect, hard recovery does not occur easily, and the surge voltage is suppressed. In such a special structure, the increase of the surge voltage is suppressed even when the defect density DDx in the region (e.g., the fourth semiconductor region 14 or the fifth semiconductor region 15) that is proximate to the first electrode 51 is high. According to the embodiment, the reverse recovery charge Qrr can be reduced by providing a configuration that is the opposite of that of the first reference example relating to the level of the defect density DDx.

An example of simulation results of the relationship between the defect density and the characteristics will now be described.

Figure 3:
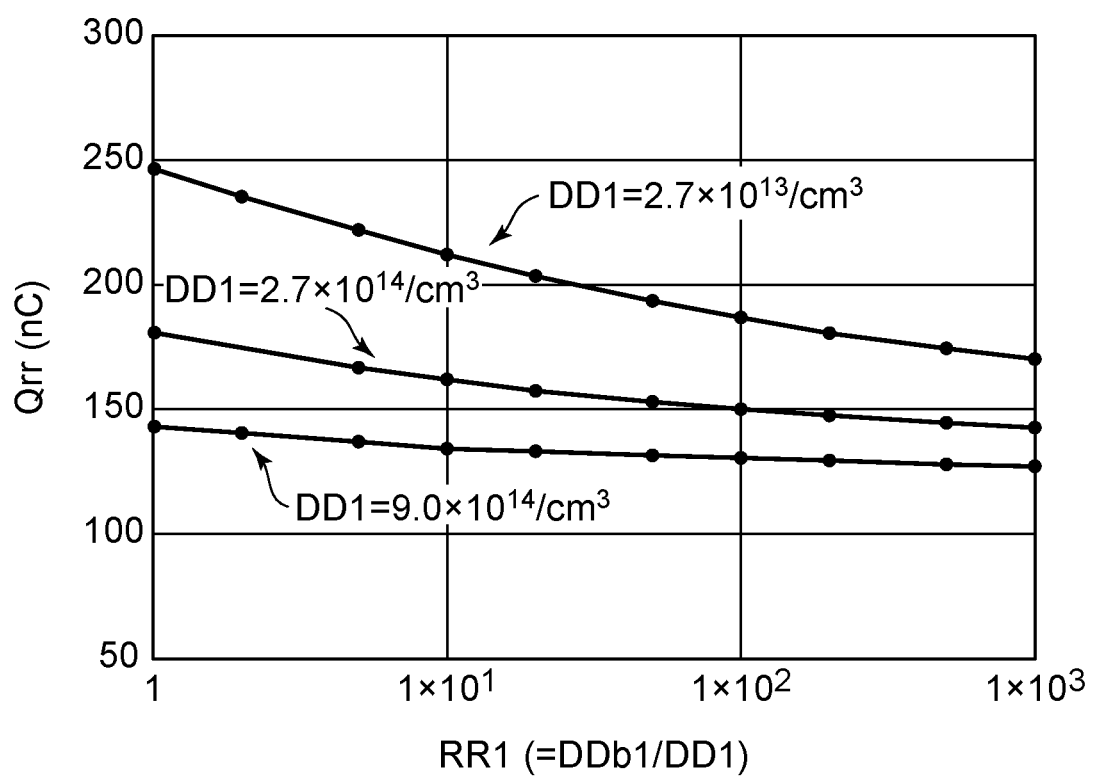
FIG. 3 is a graph illustrating characteristics of the semiconductor device.

FIG. 3 is a graph illustrating characteristics of the semiconductor device.

The horizontal axis of FIG. 3 is a ratio RR1 of the defect density DDb1 at the first boundary position pb1 to the first defect density DD1 at the first position p1. The horizontal axis is shown logarithmically. The vertical axis is the reverse recovery charge Qrr. FIG. 3 shows examples when the first defect density DD1 at the first position p1 is $2.7 \times 10^{13}/cm^3$, $2.7 \times 10^{14}/cm^3$, and $9.0 \times 10^{14}/cm^3$.

As shown in FIG. 3, the reverse recovery charge Qrr decreases as the ratio RR1 is increases. It is considered that this is caused by the reduction of the lifetime of the carriers implanted into the region of the first semiconductor region 11 at the first electrode 51 side when the ratio RR1 is high.

Comparing the examples when the first defect density DD1 is $2.7 \times 10^{13}/cm^3$, $2.7 \times 10^{14}/cm^3$, and $9.0 \times 10^{14}/cm^3$, the effect of the high ratio RR1 reducing the reverse recovery charge Qrr is markedly realized when the first defect density DD1 is low. Therefore, it is favorable for the first defect density DD1 to be low.

On the other hand, off-leakage current Idss easily increases when the first defect density DD1 is high. Therefore, according to the embodiment, it is favorable for the first defect density DD1 to be not more than $9.0 \times 10^{14}/cm^3$. A small off-leakage is obtained thereby. Also, a large effect of reducing the reverse recovery charge Qrr is obtained.

According to the embodiment as described above, a small reverse recovery charge Qrr is obtained by setting the defect density DDx in the region (e.g., the fourth semiconductor region 14 or the fifth semiconductor region 15) that is proximate to the first electrode 51 to be greater than the first defect density DD1 of the first position p1.

As described above, the maximum defect density DDk in the semiconductor member 10 is obtained at the defect peak position pDk (referring to FIG. 2C). Examples of the defect peak position pDk will now be described.

Figure 4:
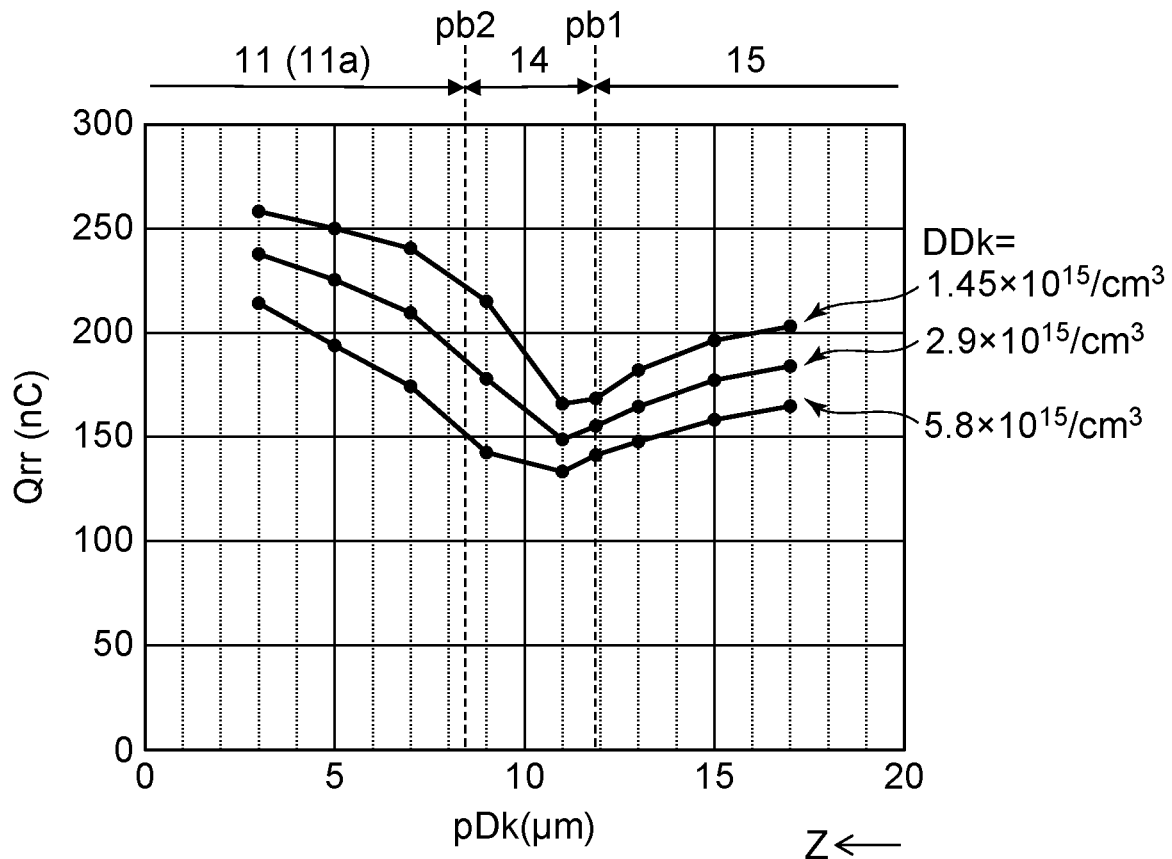
FIG. 4 is a graph illustrating characteristics of the semiconductor device.

FIG. 4 is a graph illustrating characteristics of the semiconductor device.

FIG. 4 shows an example of simulation results of characteristics when the defect peak position pDk is changed along the first direction (the Z-axis direction). The horizontal axis of FIG. 4 is the defect peak position pDk at the position pZ in the Z-axis direction. The vertical axis is the reverse recovery charge Qrr. FIG. 4 shows the first semiconductor region 11 (the first partial region 11a), the fourth semiconductor region 14, and the fifth semiconductor region 15. FIG. 4 shows when the maximum defect density DDk of the semiconductor member 10 is $5.8 \times 10^{15}/cm^3$, $2.9 \times 10^{15}/cm^3$, and $1.45 \times 10^{15}/cm^3$.

As shown in FIG. 4, the reverse recovery charge Qrr has a minimum when the defect peak position pDk is in the fourth semiconductor region 14 for each defect density DDk. The distance between the first boundary position pb1 and the position in the Z-axis direction at which the reverse recovery charge Qrr has a minimum is not less than 0.1 µm. The distance between the first boundary position pb1 and the position in the Z-axis direction at which the reverse recovery charge Qrr has a minimum may be not more than 4 µm. A smaller reverse recovery charge Qrr is obtained by the defect peak position pDk being at such a position.

The first-conductivity-type carrier concentration (the impurity concentration C1) in the fourth semiconductor region 14 is less than the first-conductivity-type carrier concentration (the impurity concentration C15) in the fifth semiconductor region 15. It is considered that the lifetime can be more effectively reduced by setting the maximum of the defect density DDx to be in a region in which the carrier concentration (the impurity concentration C1) is somewhat low. The reverse recovery charge Qrr can be more effectively reduced thereby.

For example, according to the embodiment, it is favorable for a distance d1 along the first direction between the defect peak position pDk and the first boundary position pb1 in the first direction (the Z-axis direction) of the first boundary between the fourth semiconductor region 14 and the fifth semiconductor region 15 (referring to FIG. 2C) to be not less than 0.1 µm and not more than 4 µm.

For example, the defect density DD in the fifth semiconductor region 15 is less than the defect density DD in the fourth semiconductor region 14.

As shown in FIG. 4, the reverse recovery charge Qrr can be reduced even when the defect peak position pDk is in the fifth semiconductor region 15. According to the embodiment, the defect peak position pDk may be in the fourth semiconductor region 14, in the fifth semiconductor region 15, or at the boundary (the first boundary) between the fourth semiconductor region 14 and the fifth semiconductor region 15.

According to the embodiment, the defects in the semiconductor member 10 can be formed by introducing hydrogen, etc., to the semiconductor member 10. The defect peak position pDk can be controlled by modifying the conditions when introducing hydrogen, etc. The profile of the defect density DDx may be controlled by modifying the conditions when introducing hydrogen, etc.

As shown in FIG. 2A, the fourth semiconductor region 14 may include the second position p2. The first-conductivity-type carrier concentration (the impurity concentration C1) at the second position p2 is 10% of the first-conductivity-type carrier concentration (the impurity concentration C15) in the fifth semiconductor region 15. According to the embodiment, the second defect density DD2 at the second position p2 (referring to FIG. 2C) is, for example, not less than 3.5 times the first defect density DD1. The second defect density DD2 is, for example, not more than 0.5 times the maximum defect density DDk.

The defect density DDb2 at the second boundary position pb2 in the first direction of the second boundary between the fourth semiconductor region 14 and the first semiconductor region 11 (referring to FIG. 2C) is, for example, not less than 2.4 times the first defect density DD1. The defect density DDb2 is, for example, not more than 0.3 times the maximum defect density DDk.

As shown in FIG. 1, the first partial region 11a further includes a third position p3. The direction from the third electrode end portion 53a toward the third position p3 is along the second direction (the X-axis direction). As shown in FIG. 2A, the first-conductivity-type carrier concentration (the impurity concentration C1) at the third position p3 may be substantially equal to the first-conductivity-type carrier concentration (the impurity concentration C1) at the first position p1.

As shown in FIG. 2C, the defect density at the third position p3 is taken as a third defect density DD3. The third defect density DD3 is not more than the first defect density DD1. The third defect density DD3 may be less than the first defect density DD1. The off-leakage current Idss can be further suppressed by a low defect density DDx.

According to the embodiment, for example, the defects can be formed by introducing at least one first element selected from the group consisting of hydrogen, helium, argon, and carbon. In such a case, the concentration of the first element may correspond to the defect density DDx.

An example of the concentration of the first element (hydrogen, etc.) will now be described.

Figure 5:
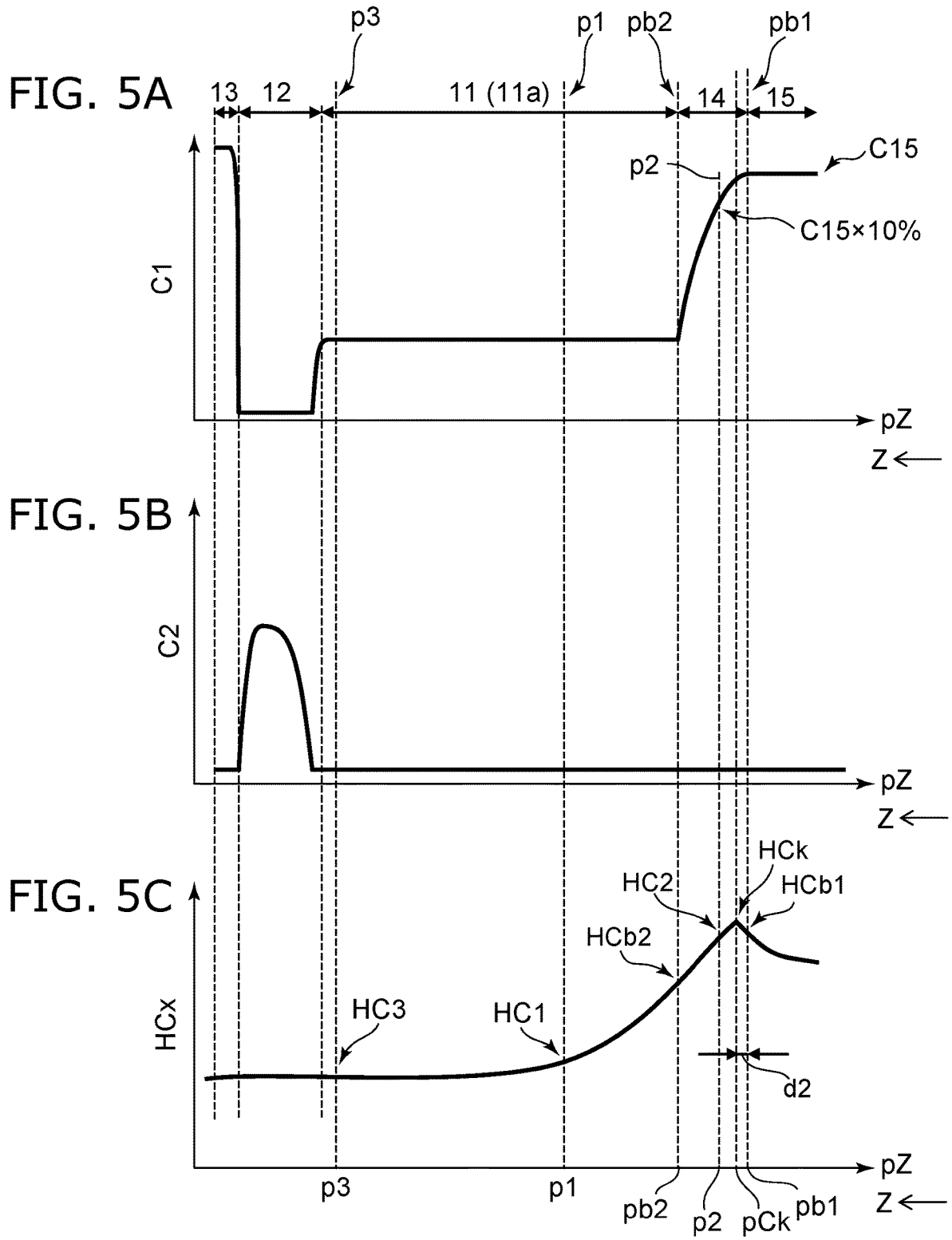
FIGS. 5A to 5C are graphs illustrating characteristics of the semiconductor device according to the first embodiment.

FIGS. 5A to 5C are graphs illustrating characteristics of the semiconductor device according to the first embodiment.

In these figures, the horizontal axis is the position pZ in the Z-axis direction. The vertical axis of FIG. 5A is the impurity concentration C1 of the first conductivity type in the semiconductor member 10. The vertical axis of FIG. 5B is the impurity concentration C2 of the second conductivity type in the semiconductor member 10. For example, the magnitude of the difference between the impurity concentration C1 and the impurity concentration C2 corresponds to the level of the carrier concentration. The vertical axis of FIG. 5C is a concentration HCx of the first element (e.g., hydrogen, etc.). The vertical axis of FIGS. 5A to 5C is shown logarithmically.

FIGS. 5A and 5B are similar to FIGS. 2A and 2B. As shown in FIG. 5C, the concentration HCx of the first element has a maximum in the fourth semiconductor region 14. The concentration HCx of the first element may have a maximum in the fifth semiconductor region 15. The concentration HCx of the first element decreases in the first semiconductor region 11 (the first partial region 11a) in the orientation from the fourth semiconductor region 14 toward the second semiconductor region 12.

The fourth semiconductor region 14 includes at least one first element selected from the group consisting of hydrogen, helium, argon, and carbon. The first position p1 does not include the first element. Or, a concentration HC1 of the first element at the first position p1 is less than the concentration HCx of the first element in the fourth semiconductor region 14. The first element becomes defects, and, for example, the reverse recovery charge Qrr can be reduced.

As shown in FIG. 5C, a first element peak position pCk in the first direction (the Z-axis direction) at which a concentration HCk of the first element that is the maximum in the semiconductor member 10 is obtained may be in the fourth semiconductor region 14, in the fifth semiconductor region 15, or at the first boundary between the fourth semiconductor region 14 and the fifth semiconductor region 15. In the example of FIG. 5C, the first element peak position pCk is in the fourth semiconductor region 14.

As shown in FIG. 5C, a concentration HCb1 of the first element at the first boundary position pb1 in the first direction (the Z-axis direction) of the first boundary between the fourth semiconductor region 14 and the fifth semiconductor region 15 is greater than the concentration HC1 of the first element at the first position p1.

As shown in FIG. 5C, the distance along the first direction to the first element peak position pCk is taken as a distance d2. As described with reference to FIG. 4, it is favorable for the distance d2 to be not less than 0.1 μm and not more than 4 μm. The reverse recovery charge Qrr can be more effectively reduced.

For example, the concentration of the first element in the fifth semiconductor region 15 is less than the concentration of the first element in the fourth semiconductor region.

As shown in FIG. 5A, the fourth semiconductor region 14 includes the second position p2. The first-conductivity-type carrier concentration (the impurity concentration C1) at the second position p2 is 10% of the first-conductivity-type carrier concentration (the impurity concentration C15) in the fifth semiconductor region 15. As shown in FIG. 5C, the concentration of the first element at the second position p2 is taken as a concentration HC2. The concentration HC2 is, for example, not less than 40 times the concentration HC1 of the first element at the first position p1. For example, the concentration HC2 is not more than 0.1 times the concentration HCk of the first element that is the maximum.

As shown in FIG. 5B, the boundary in the first direction (the Z-axis direction) of the second boundary between the fourth semiconductor region 14 and the first semiconductor region 11 is taken as the second boundary position pb2. As shown in FIG. 5C, the concentration of the first element at the second boundary position pb2 is taken as a concentration HCb2. The concentration HCb2 is, for example, not less than 8 times the concentration HC1 of the first element. The concentration HCb2 is, for example, not more than 0.02 times the concentration HCk of the first element that is the maximum.

As shown in FIG. 1, the first partial region 11a further includes the third position p3. The direction from the third electrode end portion 53a toward the third position p3 is along the second direction (the X-axis direction). As shown in FIG. 5C, the concentration of the first element at the third position p3 is taken as a concentration HC3. The concentration HC3 is not more than the concentration HC1 of the first element at the first position p1. For example, the off-leakage current Idss can be reduced because the concentration HC3 is low.

Figure 6:
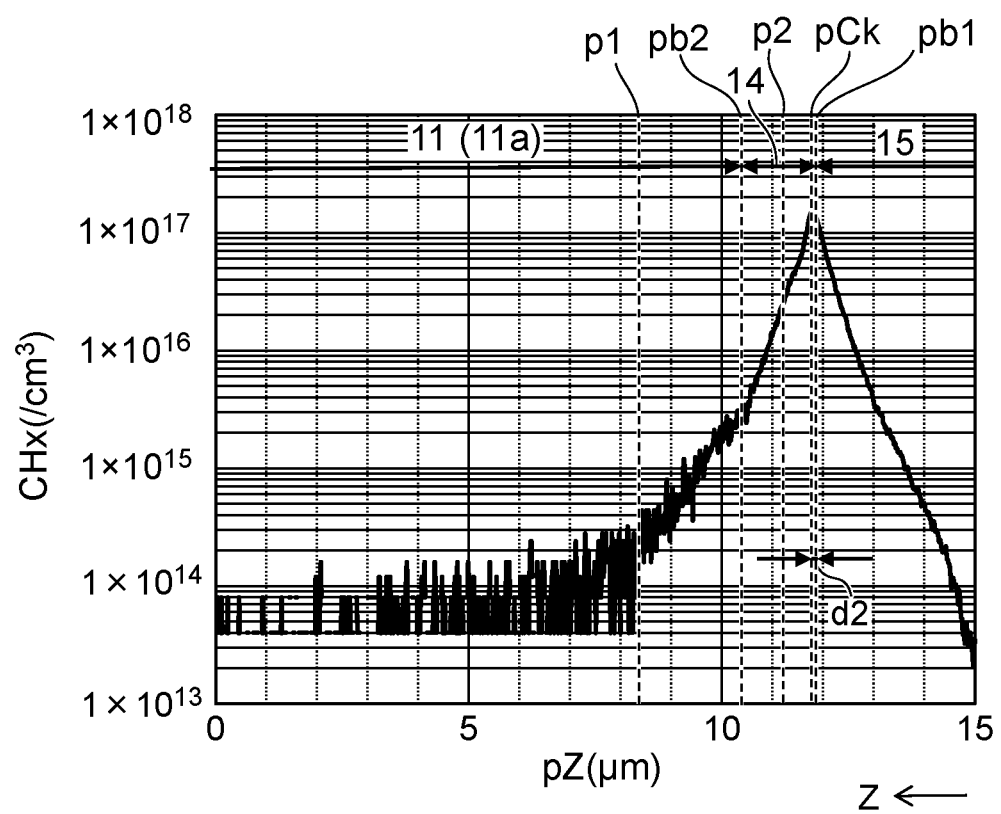
FIG. 6 is a graph illustrating a characteristic of the semiconductor device according to the first embodiment.

FIG. 6 is a graph illustrating a characteristic of the semiconductor device according to the first embodiment.

FIG. 6 illustrates the profile of the concentration HCx of the first element when the first element described above is hydrogen. The horizontal axis of FIG. 6 is the position pZ in the Z-axis direction. The vertical axis is the concentration HCx of the first element (hydrogen).

As shown in FIG. 6, the concentration HCx of the first element (hydrogen) at the first position p1 is less than the concentration HCx of the first element (hydrogen) in the fourth semiconductor region 14. The concentration HCx of the first element (hydrogen) has a maximum at the first element peak position pCk. The first element peak position pCk is in the fourth semiconductor region 14.

In the example, the distance d2 along the Z-axis direction between the first element peak position pCk and the first boundary position pb1 is about 0.18 μm. In the example, the distance along the Z-axis direction between the second position p2 and the first boundary position pb1 is about 0.5 μm. The distance d2 along the Z-axis direction between the second boundary position pb2 and the first boundary position pb1 is about 0.18 μm. In the example, the distance along the Z-axis direction between the first position p1 and the first boundary position pb1 is about 2.05 μm.

Figure 7:
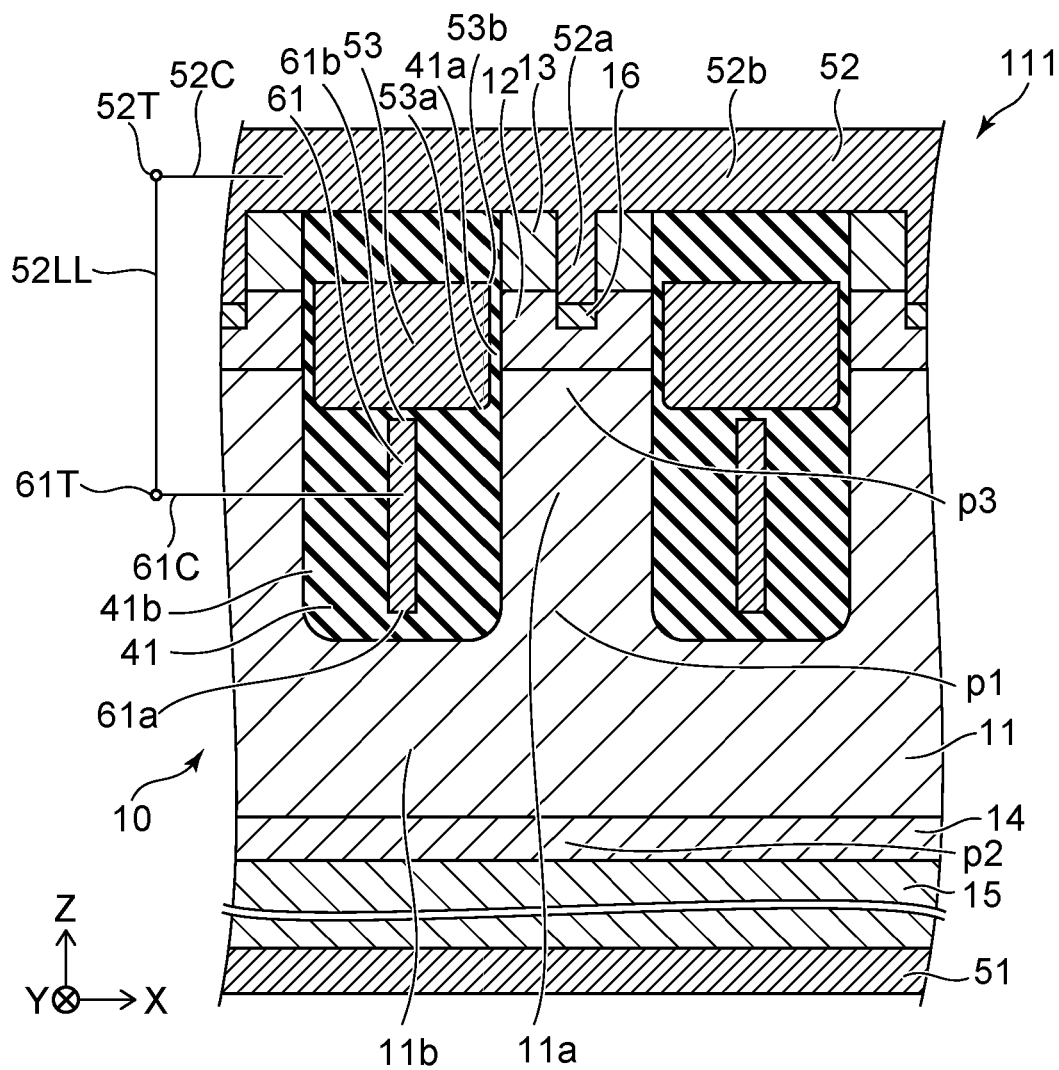
FIG. 7 is a schematic cross-sectional view illustrating a semiconductor device according to the first embodiment.

FIG. 7 is a schematic cross-sectional view illustrating a semiconductor device according to the first embodiment.

In the semiconductor device 111 according to the embodiment as shown in FIG. 7, the first conductive member 61 is separated from the third electrode 53 in the Z-axis direction. The first conductive member 61 is electrically connected with the second electrode 52. Or, the first conductive member 61 is electrically connectable with the second electrode 52. For example, the first conductive member 61 is electrically connected with the second electrode 52 via the connection member 61C, the connection member 52LL, and the connection member 52C. These connection members may be located at a position that is different from the cross section illustrated in FIG. 1. For example, the terminal 61T may be electrically connected with the terminal 52T by the connection member 52LL. The connection member 52LL may be provided separately from the semiconductor device 110. In the semiconductor device 111 as well, the defect density DDx in the fourth semiconductor region 14 is greater than the first defect density DD1. For example, the concentration HCx of the first element in the fourth semiconductor region 14 is greater than the concentration HC1 of the first element at the first position p1.

Second Embodiment

Figure 8:
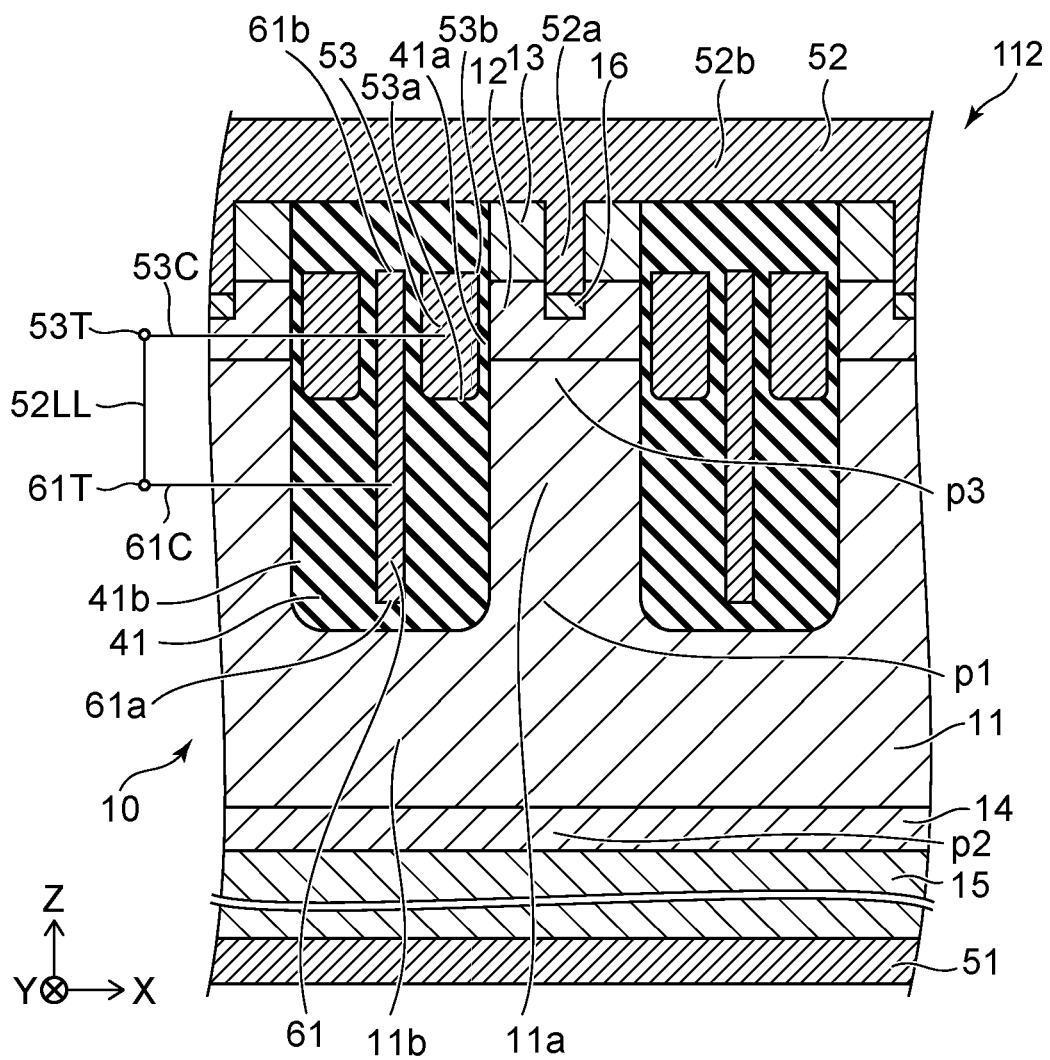
FIG. 8 is a schematic cross-sectional view illustrating a semiconductor device according to a second embodiment.

FIG. 8 is a schematic cross-sectional view illustrating a semiconductor device according to a second embodiment.

As shown in FIG. 8, the semiconductor device 112 according to the embodiment also includes the first electrode 51, the second electrode 52, the third electrode 53, the first conductive member 61, the semiconductor member 10, and the first insulating member 41. In the semiconductor device 112, the first conductive member 61 is electrically connected with the third electrode 53. Or, the first conductive member 61 is electrically connectable with the third electrode 53. Otherwise, the configuration of the semiconductor device 112 may be similar to the configuration of the semiconductor device 110.

As shown in FIG. 8, for example, the first conductive member 61 is electrically connected with the third electrode 53 via the connection member 61C, the connection member 52LL, and a connection member 53C. These connection members may be located at a position that is different from the cross section illustrated in FIG. 8. For example, a terminal 53T may be connected with the third electrode 53 via the connection member 53C. The terminal 61T may be electrically connected with the first conductive member 61 via the connection member 61C. The terminal 61T may be electrically connected with the terminal 53T by the connection member 52LL. The connection member 52LL may be provided separately from the semiconductor device 112.

In the semiconductor device 112 as well, the defect density DDx in the fourth semiconductor region 14 is greater than the first defect density DD1. For example, the reverse recovery charge Qrr can be reduced. For example, the off-leakage current can be suppressed. For example, the loss can be reduced while suppressing the off-leakage.

The defects may be formed by introducing the first element such as hydrogen, etc. In such a case, in the semiconductor device 112, for example, the first position p1 does not include the first element. Or, the concentration HC1 of the first element at the first position p1 is less than the concentration HCx of the first element in the fourth semiconductor region 14. Thereby, for example, the loss can be reduced while suppressing the off-leakage.

Figure 9:
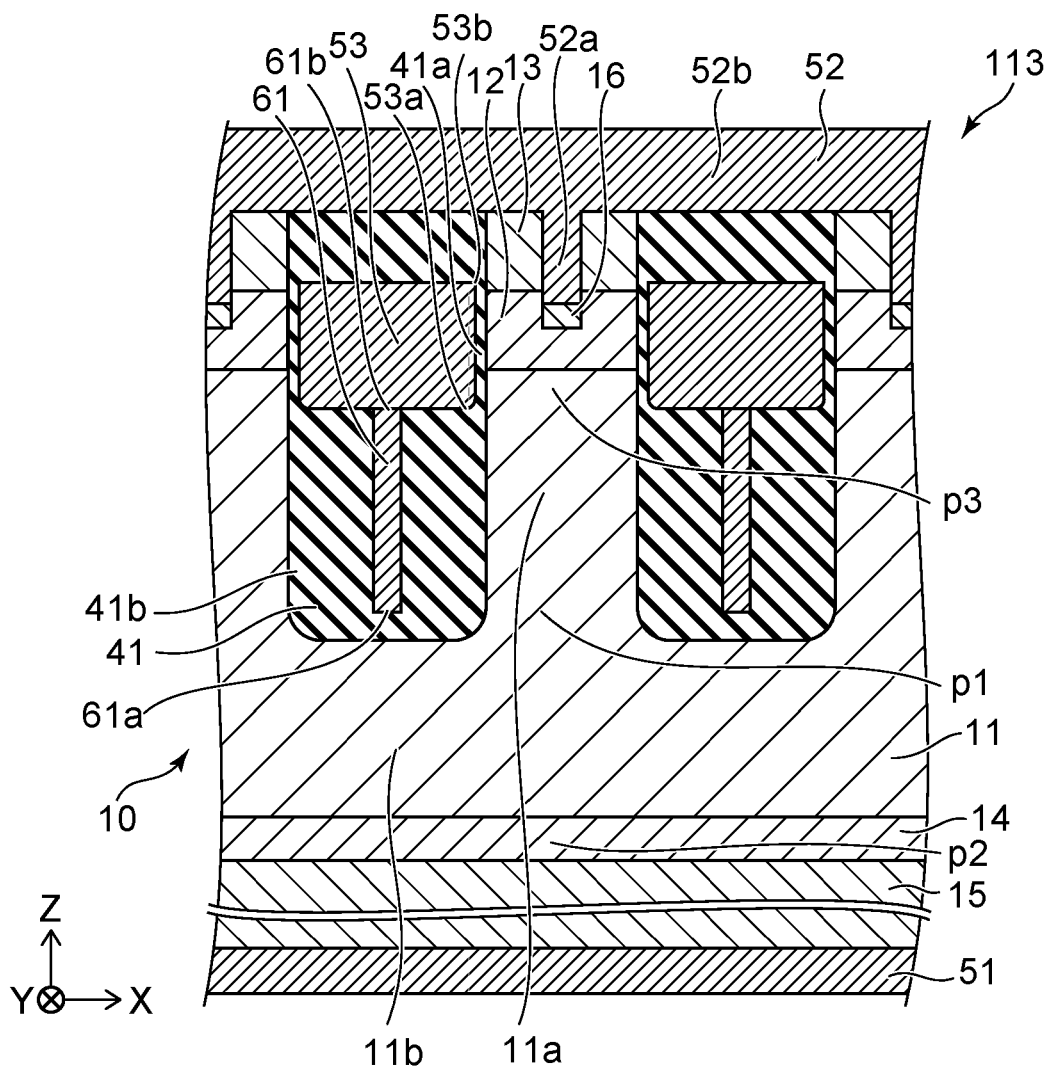
FIG. 9 is a schematic cross-sectional view illustrating a semiconductor device according to the second embodiment.

FIG. 9 is a schematic cross-sectional view illustrating a semiconductor device according to the second embodiment.

As in the example of the semiconductor device 113 according to the embodiment as shown in FIG. 9, the first conductive member 61 may be continuous with the third electrode 53. In the semiconductor device 113 as well, the defect density DDx in the fourth semiconductor region 14 is greater than the first defect density DD1. For example, the concentration HCx of the first element in the fourth semiconductor region 14 is greater than the concentration HC1 of the first element at the first position p1.

The defect peak position pDk and the first element peak position pCk are applicable to the semiconductor devices 112 and 113. For example, it is favorable for the distance d1 along the first direction between the defect peak position pDk and the first boundary position pb1 in the first direction (the Z-axis direction) of the first boundary between the fourth semiconductor region 14 and the fifth semiconductor region 15 (referring to FIG. 2C) to be not less than 0.1 μm and not more than 4 μm. For example, the distance along the first direction between the first boundary position pb1 and the first element peak position pCk is taken as the distance d2. As described with reference to FIG. 4, it is favorable for the distance d2 (referring to FIG. 5C) to be not less than 0.1 μm and not more than 4 μm.

According to embodiments described above, it is favorable for the first-conductivity-type carrier concentration in the first semiconductor region 11 to be, for example, not less than $1.0 \times 10^{15}$ cm$^{-3}$ and not more than $1.0 \times 10^{17}$ cm$^{-3}$. It is favorable for the second-conductivity-type carrier concentration in the second semiconductor region 12 to be, for example, not less than $1.0 \times 10^{16}$ cm$^{-3}$ and not more than $1.0 \times 10^{18}$ cm$^{-3}$. It is favorable for the first-conductivity-type carrier concentration in the third semiconductor region 13 to be, for example, not less than $3.0 \times 10^{18}$ cm$^{-3}$ and not more than $3.0 \times 10^{20}$ cm$^{-3}$. It is favorable for the first-conductivity-type carrier concentration in the fourth semiconductor region 14 to be, for example, not less than $1.0 \times 10^{17}$ cm$^{-3}$ and not more than $3.0 \times 10^{20}$ cm$^{-3}$. It is favorable for the first-conductivity-type carrier concentration in the fifth semiconductor region 15 to be, for example, not less than $1.0 \times 10^{19}$ cm$^{-3}$ and not more than $3.0 \times 10^{20}$ cm$^{-3}$. It is favorable for the second-conductivity-type carrier concentration in the sixth semiconductor region 16 to be, for example, not less than $1.0 \times 10^{18}$ cm$^{-3}$ and not more than $3.0 \times 10^{20}$ cm$^{-3}$.

According to embodiments described above, for example, the first-conductivity-type impurity concentration in the third semiconductor region 13 is greater than the first-conductivity-type impurity concentration in the first semiconductor region 11. For example, the first-conductivity-type impurity concentration in the fourth semiconductor region 14 is greater than the first-conductivity-type impurity concentration in the first semiconductor region 11. For example, the first-conductivity-type impurity concentration in the fifth semiconductor region 15 is greater than the first-conductivity-type impurity concentration in the fourth semiconductor region 14. For example, the second-conductivity-type impurity concentration in the sixth semiconductor region 16 is greater than the second-conductivity-type impurity concentration in the second semiconductor region 12.

It is favorable for the first-conductivity-type impurity concentration in the first semiconductor region 11 to be, for example, not less than $1.0 \times 10^{15}$ cm$^{-3}$ and not more than $1.0 \times 10^{17}$ cm$^{-3}$. It is favorable for the second-conductivity-type impurity concentration in the second semiconductor region 12 to be, for example, not less than $1.0 \times 10^{16}$ cm$^{-3}$ and not more than $1.0 \times 10^{18}$ cm$^{-3}$. It is favorable for the first-conductivity-type impurity concentration in the third semiconductor region 13 to be, for example, not less than $3.0 \times 10^{18}$ cm$^{-3}$ and not more than $3.0 \times 10^{20}$ cm$^{-3}$. It is favorable for the first-conductivity-type impurity concentration in the fourth semiconductor region 14 to be, for example, not less than $1.0 \times 10^{17}$ cm$^{-3}$ and not more than $3.0 \times 10^{20}$ cm$^{-3}$. It is favorable for the first-conductivity-type impurity concentration in the fifth semiconductor region 15 to be, for example, not less than $1.0 \times 10^{19}$ cm$^{-3}$ and not more than $3.0 \times 10^{20}$ cm$^{-3}$. It is favorable for the second-conductivity-type impurity concentration in the sixth semiconductor region 16 to be, for example, not less than $1.0 \times 10^{18}$ cm$^{-3}$ and not more than $3.0 \times 10^{20}$ cm$^{-3}$.

In embodiments, information that relates to the configurations of the semiconductor regions, etc., is obtained by, for example, electron microscopy, etc. Information that relates to the defect density DDx in the semiconductor regions is obtained by, for example, deep level transient spectroscopy (DLTS), cathode luminescence, photoluminescence, transmission electron microscopy, etc. Information that relates to the concentrations of the impurities in the semiconductor regions is obtained by, for example, EDX (Energy Dispersive X-ray Spectroscopy), SIMS (Secondary Ion Mass Spectrometry), etc. Information that relates to the carrier concentrations in the semiconductor regions is obtained by, for example, SCM (Scanning Capacitance Microscopy), etc.

According to embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being along a first direction;
a third electrode, the third electrode including a third electrode end portion and a third electrode other-end portion, the third electrode end portion being between the first electrode and the third electrode other-end portion in the first direction;
a first conductive member, the first conductive member including a first conductive member end portion and a first conductive member other-end portion, the first conductive member end portion being between the first electrode and the first conductive member other-end portion in the first direction, a position in the first direction of the first conductive member end portion being between a position in the first direction of the first electrode and a position in the first direction of the third electrode end portion, the first conductive member being electrically connected with one of the second electrode or the third electrode or being electrically connectable with the one of the second electrode or the third electrode;
a semiconductor member, the semiconductor member including a first semiconductor region of a first conductivity type, a second semiconductor region of a second conductivity type, a third semiconductor region of the first conductivity type, and a fourth semiconductor region of the first conductivity type; and
a first insulating member,
the first semiconductor region including a first partial region and a second partial region,
the first partial region being between the first electrode and the second electrode in the first direction,
the second semiconductor region being between the first partial region and the third semiconductor region in the first direction,
the third semiconductor region being electrically connected with the second electrode,
a second direction from a portion of the third electrode toward the second semiconductor region crossing the first direction,
a direction from an other portion of the third electrode toward a portion of the first partial region being along the second direction,
a direction from the second partial region toward the first conductive member being along the first direction,
a direction from the first conductive member toward the first partial region being along the second direction,
the fourth semiconductor region being located between the first electrode and the first semiconductor region in the first direction,
the fourth semiconductor region being electrically connected with the first electrode,
a carrier concentration of the first conductivity type in the fourth semiconductor region being greater than a carrier concentration of the first conductivity type in the first semiconductor region,
the first partial region including a first position,
a direction from the first conductive member end portion toward the first position being along the second direction,
a defect density in the fourth semiconductor region being greater than a first defect density at the first position; and
at least a portion of the first insulating member being between the semiconductor member and the third electrode and between the semiconductor member and the first conductive member.

2. The device according to claim 1, wherein
a maximum defect density of the semiconductor member is obtained at a defect peak position in the first direction, and
the defect peak position is in the fourth semiconductor region.

3. The device according to claim 2, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region,
a distance along the first direction between the defect peak position and a first boundary position in the first direction of a first boundary is not less than 0.1 µm and not more than 4 µm, and
the first boundary is between the fourth semiconductor region and the fifth semiconductor region.

4. The device according to claim 2, wherein
a defect density at a second boundary position in the first direction of a second boundary between the fourth semiconductor region and the first semiconductor region is not less than 3.5 times the first defect density and not more than 0.5 times the maximum defect density.

5. The device according to claim 1, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region,
a maximum defect density of the semiconductor member is obtained at a defect peak position in the first direction, and the defect peak position is in the fourth semiconductor region or the fifth semiconductor region.

6. The device according to claim 1, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region, and
a defect density in the fifth semiconductor region is less than the defect density in the fourth semiconductor region.

7. The device according to claim 1, wherein
the first partial region further includes a third position,
a direction from the third electrode end portion toward the third position is along the second direction, and
a third defect density at the third position is not more than the first defect density.

8. The device according to claim 1, wherein
the fourth semiconductor region includes at least one first element selected from the group consisting of hydrogen, helium, argon, and carbon, and
the first position does not include the first element, or a concentration of the first element at the first position is less than a concentration of the first element in the fourth semiconductor region.

9. The device according to claim 8, wherein
a maximum concentration of the first element in the semiconductor member is obtained at a first element peak position in the first direction, and
the first element peak position is in the fourth semiconductor region.

10. The device according to claim 9, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region,
a distance along the first direction between the first element peak position and a first boundary position in the first direction of a first boundary is not less than 0.1 µm and not more than 4 µm, and
the first boundary is between the fourth semiconductor region and the fifth semiconductor region.

11. The device according to claim 9, wherein
a concentration of the first element at a second boundary position in the first direction of a second boundary is not less than 40 times the concentration of the first element at the first position and not more than 0.1 times the maximum concentration of the first element, and
the second boundary is between the fourth semiconductor region and the first semiconductor region.

12. The device according to claim 8, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region,
a maximum concentration of the first element in the semiconductor member is obtained at a first element peak position in the first direction, and
the first element peak position is in the fourth semiconductor region or the fifth semiconductor region.

13. The device according to claim 8, wherein
the semiconductor member further includes a fifth semiconductor region,
a carrier concentration of the first conductivity type in the fifth semiconductor region is greater than the carrier concentration of the first conductivity type in the fourth semiconductor region,
the fourth semiconductor region is between the fifth semiconductor region and the first semiconductor region, and
a concentration of the first element in the fifth semiconductor region is less than the concentration of the first element in the fourth semiconductor region.

14. The device according to claim 8, wherein
the first partial region further includes a third position,
a direction from the third electrode end portion toward the third position is along the second direction, and
a concentration of the first element at the third position is not more than the concentration of the first element at the first position.

15. The device according to claim 1, wherein
a position in the second direction of the third electrode is between a position in the second direction of the first conductive member and a position in the second direction of the first partial region.

16. The device according to claim 1, wherein
a position in the first direction of the third electrode is between a position in the first direction of the first electrode and a position in the first direction of the second electrode.

17. The device according to claim 1, wherein
the semiconductor member further includes a sixth semiconductor region located between the second semiconductor region and the second electrode,
the sixth semiconductor region is of the second conductivity type, and
a carrier concentration of the second conductivity type in the sixth semiconductor region is greater than a carrier concentration of the second conductivity type in the second semiconductor region.

* * * * *